United States Patent [19]

Watanabe

[11] Patent Number: 4,511,980
[45] Date of Patent: Apr. 16, 1985

[54] ELECTRON BEAM EXPOSURE APPARATUS

[75] Inventor: Susumu Watanabe, Kawasaki, Japan

[73] Assignee: Tokyo Shibaura Denki Kabushiki Kaisha, Kawasaki, Japan

[21] Appl. No.: 388,936

[22] Filed: Jun. 16, 1982

[30] Foreign Application Priority Data

Jun. 17, 1981 [JP] Japan .................................. 56-93408

[51] Int. Cl.³ .............................................. H01J 3/12
[52] U.S. Cl. ................................... 364/491; 250/398; 250/492.3; 364/571
[58] Field of Search ............................... 364/488–491, 364/524, 571, 517, 521, 525; 250/492.1–492.3, 398; 382/8, 33, 54

[56] References Cited

U.S. PATENT DOCUMENTS 3,900,737  8/1975  Collier et al. .
3,943,344  3/1976  Kidode et al. ...................... 364/525
4,280,186  7/1981  Hidai et al. ....................... 250/492.3
4,387,433  6/1983  Cardenia et al. ................. 250/492.2
4,390,788  6/1983  Hayashi et al. ................... 250/491.1
4,430,571  2/1984  Smith et al. ....................... 250/492.2

Primary Examiner—James D. Thomas
Assistant Examiner—Dale M. Shaw
Attorney, Agent, or Firm—Finnegan, Henderson, Farabow, Garrett & Dunner

[57] ABSTRACT

Dot pattern data stored in the first dot pattern memory is read out by a predetermined number of successive bits at a time under the control of a microprocessor and corrected with respect to an X direction. The corrected dot pattern data is temporarily stored in a main memory. The dot pattern data stored in the main memory is then corrected with respect to a Y direction. The resultant corrected dot pattern data is stored in a second dot pattern memory for use for electron beam blanking control.

4 Claims, 9 Drawing Figures

ELECTRON BEAM EXPOSURE APPARATUS

BACKGROUND OF THE INVENTION

This invention relates to an electron beam exposure apparatus of raster scan type for line scanning an exposure medium, such as a semiconductor wafer or a mask, with an electron beam of small amplitude while the medium is moved in a direction perpendicular to the line scan direction so as to draw a pattern on the medium.

The electron beam exposure apparatus of raster scan type usually has a construction as shown in FIG. 1. The apparatus includes a control computer which effects input and output processing of various data and controls the apparatus. Data corresponding to a pattern to be drawn is fed from a magnetic tape device 2 to the computer 1. The input data is converted into data suited for a function generator to be described later and then stored in a magnetic disk device 3. The stored data is transferred from the computer 1 to the electron beam exposure apparatus 4 when drawing the pattern. The exposure apparatus 4 includes an operation panel 5, a control interface 6 coupled to the operation panel 5, and a deflector 7 for deflecting an electron beam. The apparatus 4 further includes a stage 9, on which a medium 8, for instance a mask, on which to draw a pattern, is placed. The stage 9 is operated by a motor 10. The apparatus further includes an electron gun 11 for generating an electron beam 12. Along the path of the electron beam 12 from the electron gun 11, an electrostatic deflecting plate 13 for electrostatically deflecting the electron beam 12 and an electron lens 14 are provided. The electron lens 14 and electron gun 11 are furnished with power from a power source circuit 15. The component parts mentioned above are supported on a quake-proof base 16.

In the operation of the electron beam exposure apparatus to draw a pattern on the mask 8, the electron beam 12 from the electron gun 11 is deflected by the electrostatic deflecting plate 13 to scan the mask with a constant amplitude, as shown at A in FIG. 2. Concurrently, the stage 9 is continuously moved by the motor 10 at a constant speed in a direction Y perpendicular to the direction X of scanning by the electron beam 12. Thus, a rectangular region 8a of the mask 8 having a constant width A is scanned. When the region 8a is entirely scanned from the upper end to the lower end of the mask 8, the stage 9 is displaced sidewise, i.e., in the direction X, by the same amount as the electron beam scan amplitude A. The next rectangular region 8b adjacent to the first one 8a is now scanned from the lower end to the upper end. In this way, successive rectangular regions are progressively scanned to cover the entire surface of the mask 8. While the mask 8 is being scanned in the above manner, pattern data stored in the magnetic disk device 3 is transferred through the control computer 1 to the control interface 6 and stored in a buffer memory, not shown, provided in the control interface 6. The stored data is converted by a function generator into dot pattern data. The dot pattern data thus obtained is stored in a dot pattern memory and read out therefrom to be used for blanking (ON/OFF) control of the electron beam 12. In the above way, a pattern corresponding to the pattern data stored in the buffer memory in the control interface 6 is formed on the mask 8 according to the scanning of the mask 8 by the electron beam 12.

With this apparatus, the dot pattern data produced from the function generator may contain protrusion patterns or space patterns as typically shown in FIGS. 3A and 3B, which result from errors generated in quantization in the dot pattern conversion or errors generated in data conversion process in the computer 1 prior to the quantization process. In another aspect, it is thought that when the electron beam 12 strikes the exposure medium i.e. the wafer or mask, charge is developed and stored around the point of incidence of beam according to the Gaussian curve. This is thought to take place even if the beam diameter is infinitesimally reduced. Therefore, in a case where two patterns are located in the close proximity to each other, these patterns are liable to be distorted due to a proximity effect as shown in FIG. 3C. This results from an overlapping effect of the charge that is stored in the manner as described above on areas which are not directly impinged upon by the electron beam (these areas becoming etchable in case of a positive photoresist). Further, for correcting (either increasing or reducing) pattern dimensions, the relevant data is converted by the computer 1 into data suitable for the function generator or appropriately processed when they are read out from the magnetic tape device 2 before being supplied to the function generator. Therefore, an extended process period is required for the computer processing to reduce the system efficiency.

SUMMARY OF THE INVENTION

An object of the invention is to provide an electron beam exposure apparatus of raster scan type, in which the correction of pattern data for protrusion patterns, space patterns, distortions and pattern dimensions can be readily and accurately done without using any control computer, thus reducing the data conversion processing period required by the control computer and improving the system efficiency.

According to the invention, this object is attained by an electron beam exposure apparatus, which comprises a buffer memory for temporarily storing input pattern data, a function generator for converting the pattern data stored in the buffer memory into corresponding dot pattern data according to a predetermined function, first memory means for storing dot pattern data obtained from the function generator, dot pattern correcting means for effecting a predetermined pattern correction process on the dot pattern data stored in the first memory means to obtain corrected dot pattern data, second memory means for storing the corrected dot pattern data, and means for directing an electron beam modulated according to the corrected dot pattern data read out from the second memory means to an exposure medium.

DETAILED DESCRIPTION OF THE PREFERRED EMBODIMENT

Figure 1:
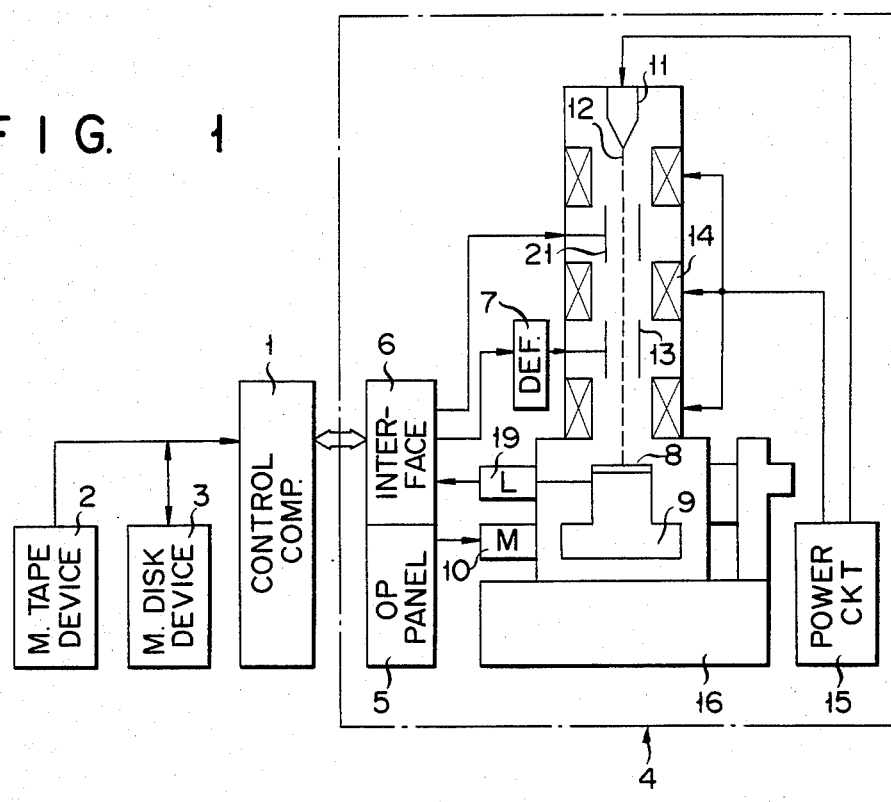
FIG. 1 is a block diagram showing an electron beam exposure apparatus to which the invention is applied.
Figure 2:
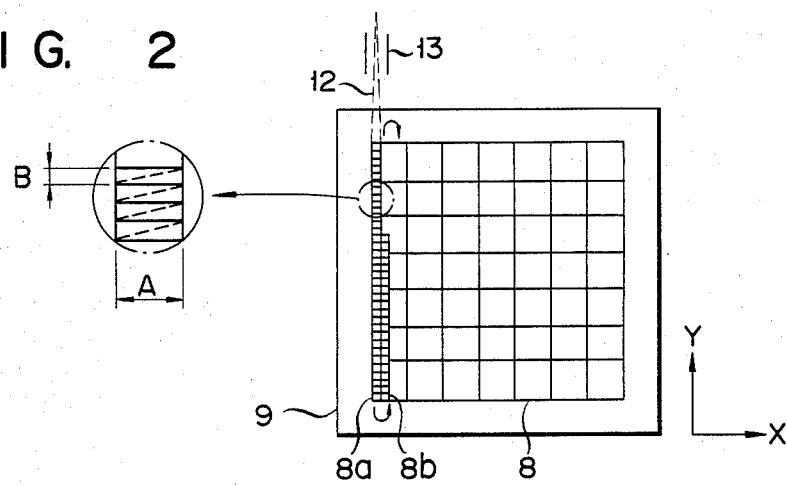
FIG. 2 is a view for explaining the manner of electron beam scanning of an exposure medium with the apparatus of FIG. 1.

Now, an embodiment of this invention will be described in detail with reference to the drawings. The embodiment is an electron beam exposure apparatus of raster scan type, and its construction is entirely the same as the apparatus shown in FIG. 1 except for the control interface 6. The following description therefore also includes reference to FIG. 1.

Figure 4:
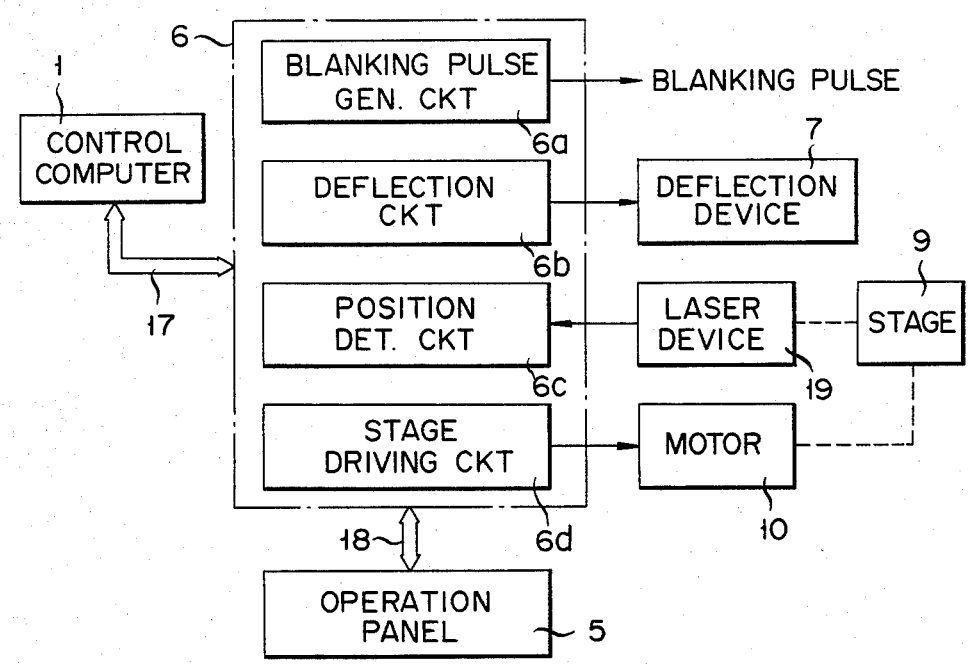
FIG. 4 is a block diagram showing a control interface shown in FIG. 1.

FIG. 4 shows the control interface 6 used in one embodiment of this invention. The control interface 6 is coupled to the control computer 1 via control/data bus 17. It is also coupled to the operation panel 5 via a control bus 18. The control interface 6 includes a blanking pulse generating circuit 6a, a deflection circuit 6b, a position detecting circuit 6c and a stage driving circuit 6d. Pattern data read out from the magnetic disk device 3 is supplied from the control computer 1 to the blanking pulse generating circuit 6a via the bus 17. The blanking pulse generating circuit 6a forms corresponding dot pattern data which is supplied as blanking pulse output to a blanking electrode 21. In this embodiment, a predetermined pattern correction process, which will be described hereinafter in detail, is effected when the dot pattern data is formed. The deflecting circuit 6b is operated in synchronism with the dot pattern data thus formed to produce an electron beam deflection signal supplied to the deflector 7. The position detecting circuit 6c is coupled to a laser device 19. The prevailing position of the stage 9 is detected by irradiating the stage 9 with a laser beam from the laser device 19 in a well-known manner. The stage driving circuit 6d controls the motor 10 to drive the stage 9 in accordance with the progress of the patterning on the exposure medium, i.e., the mask, with the electron beam.

Figure 5:
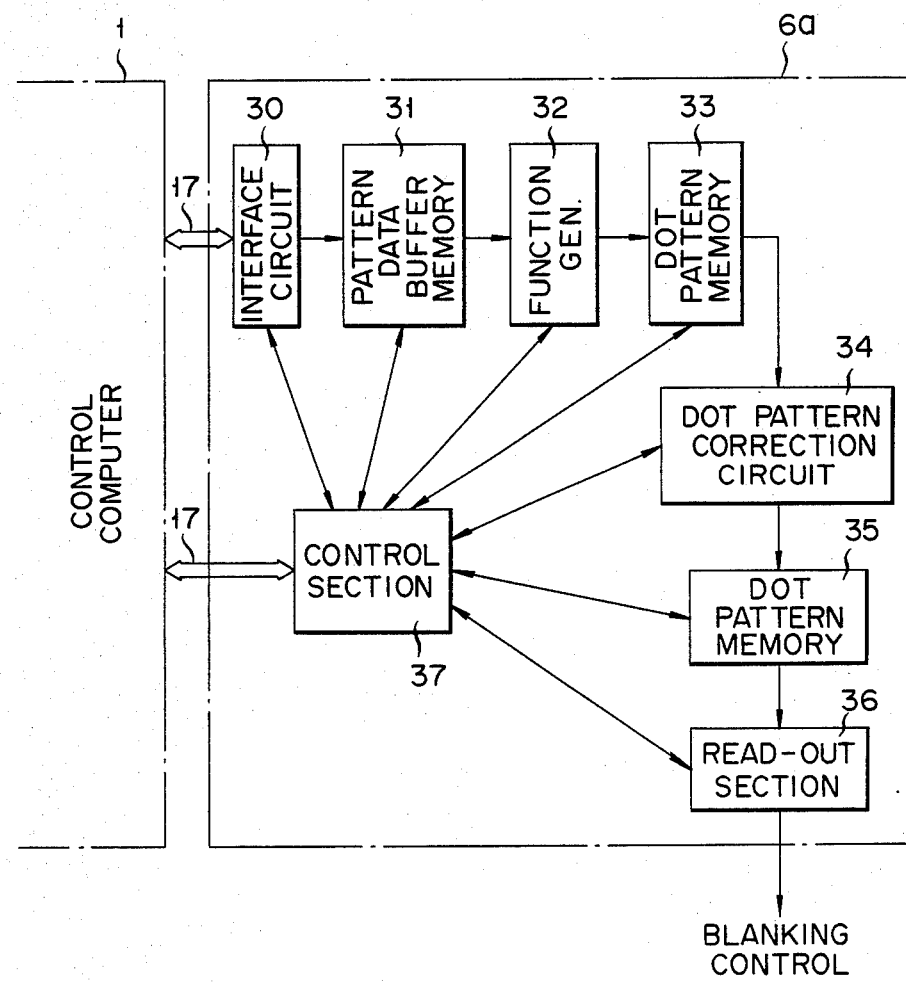
FIG. 5 is a block diagram showing a blanking pulse generating circuit in one embodiment of the electron beam exposure apparatus according to the invention.

FIG. 5 shows the blanking pulse generating circuit 6a in detail. The pattern data read out from the magnetic disk device 3 of FIG. 1, for unit surface area of the mask 8, is transferred from the control computer 1 to an interface circuit 30 via the bus 17. The interface circuit 30 is provided for the purpose of waveform shaping, amplification, etc. The pattern data from the interface circuit 30 is temporarily stored in a buffer memory 31. The pattern data is then read out from the buffer memory 31 and supplied to a function generator 32. In the function generator 32 the data is converted into corresponding dot pattern data of a predetermined function. The pattern data represents a basic drawing constituting a pattern, for instance, it may be a drawing data representing a trapezoid or a rectangle. The function generator 32 generates dot pattern data corresponding to the input drawing data, and it may be of any well-known construction.

Figure 3A:
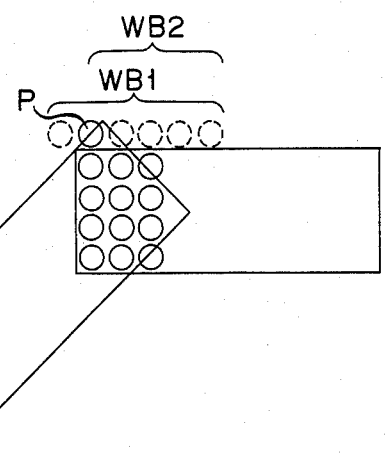
FIGS. 3A to 3C are views showing examples of dot pattern formed on the exposure medium.
Figure 3B:
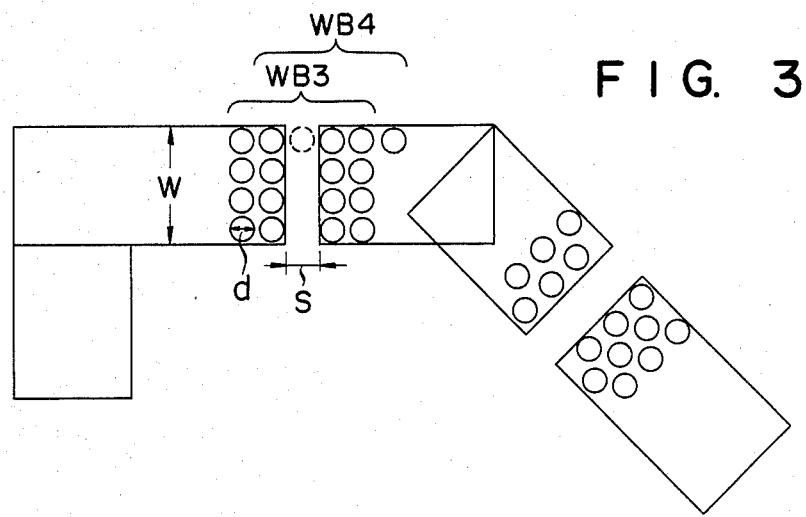
Figure 3C:
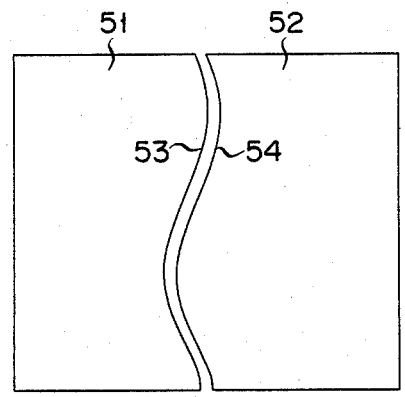

The dot pattern data generated from the function generator 32 is stored in a first dot pattern memory 33. The dot pattern data stored in the dot pattern memory 33 is progressively read out therefrom to be supplied to a dot pattern correcting circuit 34 for a predetermined pattern correction. The dot pattern data after the pattern correction is stored in a second dot pattern memory 35. The dot pattern correcting circuit 34 has a microcomputer construction as will be described later, and effects correction of dot pattern data for protrusion pattern due to noise, space pattern due to drop-out of pattern data and distortion due to location of patterns in the proximity of each other, as shown in FIGS. 3A to 3C.

The dot pattern data stored in the second dot pattern memory 35 is read out by a reading section 36 in accordance with the movement of the stage 9, and is supplied as a blanking signal to the blanking electrode 21.

The operation of the circuits 30 to 36 of the blanking pulse generating circuit 6a is controlled by a control section 37 which is coupled to the control computer 1 via the bus 17.

Figure 6:
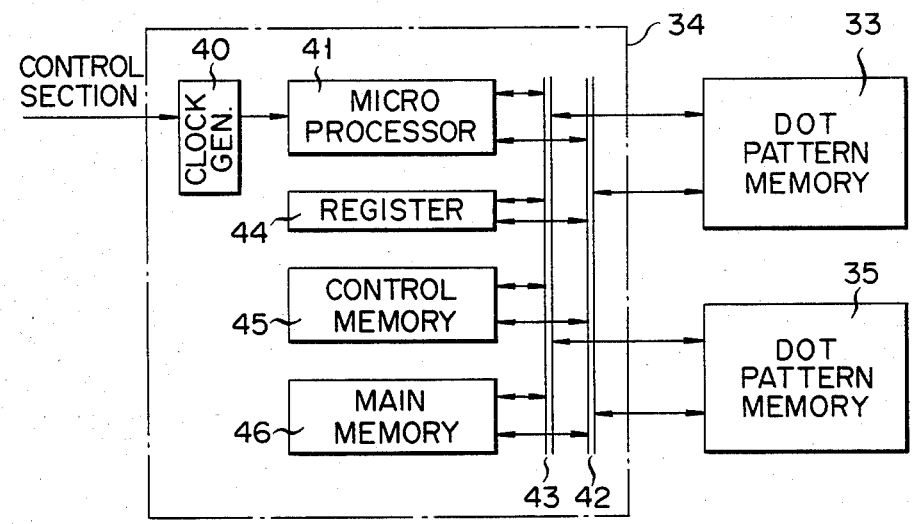
FIG. 6 is a block diagram showing the detailed construction of a part of the circuit of FIG. 5.

FIG. 6 shows the dot pattern correcting circuit 34 in detail. A timing control signal is supplied from the control section 37 to a clock generator 40 in the correcting circuit 34. The clock generator 40 generates a clock signal which is supplied to a microprocessor 41. The microprocessor 41 controls the dot pattern data correcting operation. It supplies a given address specifying signal to the first dot pattern memory 33 through a control bus 42, thus causing given dot pattern data which is to be corrected to be read out on a data bus 43. The second dot pattern memory 35, like the first, is coupled to the microprocessor 41 via the control bus 42 and data bus 43.

The dot pattern correcting circuit 34 further includes a universal register 44, a control memory 45 and a main memory 46, these component circuits being all coupled to the microprocessor 41 via the control bus 42 and data bus 43. The control memory 45 is a program memory in which a control sequence data of a dot pattern correction process is stored.

Now, the operation of one embodiment of the invention will be described in detail with reference to FIGS. 3 and 6 to 7. It is assumed that the minimum width W of the dot pattern to be formed on the mask 8 is 4 $\mu$m and the diameter of the dot formed by the electron beam 12 is substantially 1 $\mu$m. This means that the minimum dot pattern width corresponds to four dots as shown in FIG. 3A and the width S of a space resulting from a drop-out of data corresponding to four dots in the pattern width direction is substantially 1 $\mu$m. It is of course possible to freely set the dot pattern width; for instance it may be set to 5 $\mu$m corresponding to five dots. It may also be varied by varying the beam diameter, i.e., the dot diameter.

When dot pattern data for a unit area, generated from the function generator 32, is completely written in the first dot pattern memory 33, an initialize signal is provided from the control section 37 to the correcting circuit 34. In response to this initialize signal, the microprocessor 41 specifies an area of the first dot pattern memory 33 to read out dot pattern data WB of 5 bits in the X direction from a first address location (XB=1, YB=1) of the memory 33. This operation is shown as a first step S1 in the flow chart of FIG. 7. The number WB=5 of bits to be read out at one time from the first dot pattern memory 33 is thus set to the minimum pattern width dot number 4 plus 1. In a second step S2, the 5-bit data WB thus read out is transferred to the universal register 44 under the control of the microprocessor 41.

Suppose now that a 5-bit data WB1 (01000) in a dot pattern data containing protrusion data P as shown in FIG. 3A is transferred to the register 44. The correction for this protrusion data pattern is executed in a third step S3. Since the minimum dot pattern width corresponds to 4 bits as mentioned earlier, there is no regular dot pattern with a width corresponding to three or less dots. Thus, a dot pattern of three or less bits has to be deleted as an irregular protrusion data pattern. In the step S3, if there is one to three "1" bits between two "0" bits, these "1" bits are all converted to "0" bits. Thus, the dot pattern WB1 (01000) is converted to (00000). This conversion is entirely undertaken by the microprocessor 41.

When the correction of the data WB1 for the protrusion data pattern is ended, a fourth step S4 is executed, in which correction for a space pattern SB is made. The regular minimum pattern space is set to 4 μm corresponding to four dots. Thus, if the number of "0" bits between the "1" bit corresponding to the end dot of a dot pattern and the "1" bit corresponding to the opposite end dot of an adjacent dot pattern is 3 or less, this pattern space is not regular. In this case, all the "0" bits constituting the space have to be converted to "1" bits.

Suppose now that data WB3 (11011) is stored as shown in FIG. 3B as the unit dot pattern data in the universal register 44. In this case, the "0" bit as the third bit from the leading bit and corresponding to a space S, is converted to a "1" bit in the space pattern correcting operation, thus obtaining a data (11111). When this conversion of the data WB3 is ended, the operation is shifted to the step S5 wherein the first bit of "1" in the resultant unit dot pattern data WB3 is stored in the corresponding location of the main memory 46.

In this case, the address pointer of the dot pattern memory 33 is shifted by 1 in the X direction and the whole bits in the register 44 are shifted to left by one. The fifth bit location in the register 44 receives a new bit data from the memory 33. When the execution of the step S5 is completed a step S6 is executed, in which a check is made as to whether pattern correction has been made on all the bits in the X direction with respect to a particular YB bit position. If the result of this check is NO, the operation returns to the step S3.

When the correction for the protrusion pattern in the step S3 is ended, space pattern correction is made in the step S4. Suppose that data WB4 (10111) shown in FIG. 3B is stored as the unit dot pattern data in the universal register 44. In this case the second bit is "0". This "0" bit is converted in the space pattern correction in the step S4 into a "1" bit. When this conversion of the data WB4 is ended, the first bit "1" in the unit dot pattern data WB1 is stored in the corresponding location of the main memory 46. The correction of the step S4 for the last 5-bit unit dot pattern data in one line data specified by a particular YB dot data, is completed, while the XB bit is shifted one by one. At this time, the data transfer from the first memory 33 to the right end location in the register 44 is not effected at the step S5. Accordingly, it is noted that the scanning of the whole bits in the X direction specified by a particular YB dot data is completed in the step S6.

The operation then proceeds from the step S6 to the step S7. If the scanning of all bits in the X direction with respect to YB=1 in the first dot pattern memory 33, for instance, has been completed, the corrected last four bits in the register 44 are stored at the corresponding memory location in the main memory 46. Then, the address pointer of YB is shifted to the position for YB=2. In this case, it is determined in the step S8 that the scanning of all bits in the Y direction is not ended, and the operation returns to the step S2. Now, the steps S2 through S6 are executed for the line of YB=2, and the corrected dot pattern data are stored in the main memory 46.

When the correction of all the data stored in the first dot pattern memory 33 is completed, the corrected dot pattern data are stored in the main memory 46. Then, a step S9 is executed, in which corrected dot pattern data, corrected with respect to the X direction, stored in the main memory 46 is transferred to the first dot pattern memory 33. In this state, a dot pattern correction process similar to that through the steps S1 through S8 is effected by changing the direction of scanning by the address pointer of the first dot pattern memory 33 from the X direction to the Y direction under the control of the microprocessor 41. At this time, the corrected dot pattern data may be successively stored bit by bit in the main memory 46, and at the last time these data may be transferred at a time to the second dot pattern memory 35. Alternatively, the data may be directly stored in the second dot pattern memory 35 without agency of the main memory 46. In this way, corrected dot pattern data, corrected for protrusion patterns and space patterns with respect to both X and Y directions, are stored in the second dot pattern memory 35.

Figure 7:
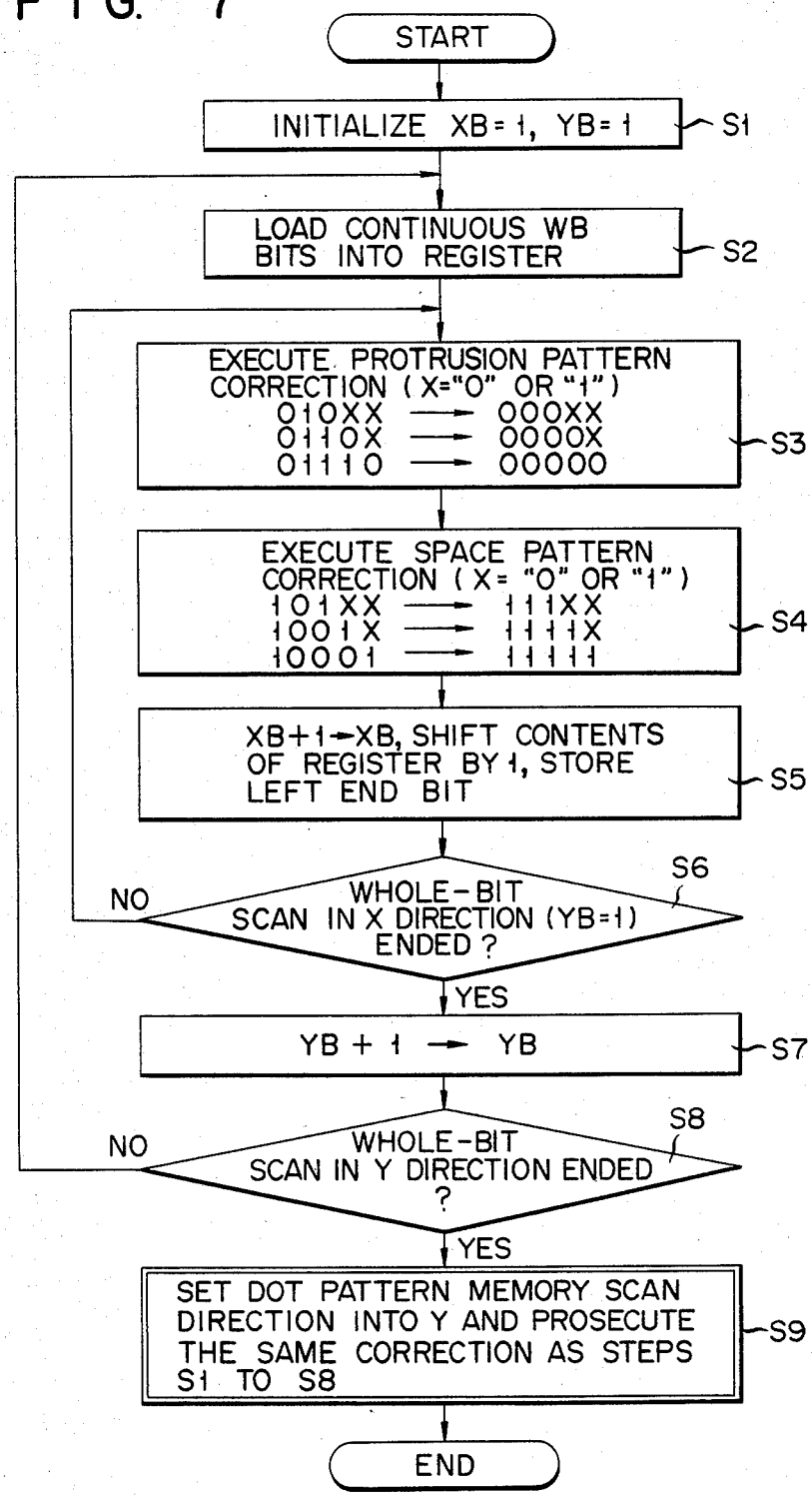
FIG. 7 is a flow chart for explaining the operation of the circuit of FIG. 6.

While the description so far using the flow chart of FIG. 7 has been concerned with the correction of the protrusion pattern and space pattern shown in FIGS. 3A and 3B, it is also possible to make correction for distortion due to the location of adjacent profile lines of two patterns 51 and 52 shown in FIG. 3C in the proximity of each other. Suppose that the regular minimum spacing between two patterns 51 and 52 is set to 4 μm. In this case, whether a portion of the dot pattern data read out from the first dot pattern memory 33 that corresponds to the 4 μm space is correctly drawn to have a four-bit space irrespective of the cumulating effect of charges may be checked, and if they are three or less or five or greater in number, they may be corrected to be four in number.

As has been described in the foregoing, with the electron beam exposure apparatus according to the invention, it is possible to make correction of dot pattern for protrusion patterns and drop-outs due to noise or errors resulting from data conversion or quantization and also correction of data for distortion due to proximity location. Further, unlike the prior art the correction is done not with any data conversion software but with dot patterns as the direct subject of correction. Thus, high speed and reliable dot pattern correction can be obtained with a dot pattern correcting circuit using a comparatively simple algorithm. It is thus possible to reduce the data conversion period required by the control computer and improve the system efficiency.

What is claimed is:

1. An electron beam exposure apparatus, comprising:
   a buffer memory for temporarily storing input pattern data,
   a function generator responsive to said buffer memory for converting the pattern data stored in said buffer memory into corresponding dot pattern data according to a predetermined function,
   first memory means for storing dot pattern data obtained from said function generator,
   means for correcting an error occurring in an individual dot in the dot pattern data obtained from said function generator and stored in said first memory means so as to obtain corrected dot pattern data, second memory means for storing the corrected dot pattern data, and means for directing an electron beam modulated according to the corrected dot pattern data read out from said second memory means to an exposure medium.

2. The electron beam exposure apparatus according to claim 1, wherein said dot pattern correcting means includes a microprocessor.

3. The electron beam exposure apparatus according to claim 2, wherein said dot pattern correcting means is controlled by said microprocessor and includes a register for storing dot pattern data consisting of a predetermined number of successive bits read out from said first memory means an a main memory for temporarily storing the corrected dot pattern data.

4. The electron beam exposure apparatus according to claim 2, wherein said dot pattern correcting means includes:

a register in which the pattern data, read out from the first memory means and corrected with respect to an X direction, is stored a predetermined number of successive bits at a time under control of said microprocessor; and a main memory for temporarily storing the corrected dot pattern data, said dot pattern data stored in the main memory being corrected with respect to a Y direction under control of said microprocessor, with the resultant corrected dot pattern data being stored in said second memory means for use by an electron beam blanking control.

* * * * *